(12) United States Patent
Pang et al.

(10) Patent No.: US 8,610,333 B2
(45) Date of Patent: Dec. 17, 2013

(54) ACOUSTIC WAVE DEVICES

(76) Inventors: Wei Pang, Beijing (CN); Hao Zhang, Zhuhai (CN)

( * ) Notice: Subject to any disclaimer, the term of this patent is extended or adjusted under 35 U.S.C. 154(b) by 68 days.

(21) Appl. No.: 12/889,971

(22) Filed: Sep. 24, 2010

(65) Prior Publication Data

US 2012/0074811 A1 Mar. 29, 2012

(51) Int. Cl.
*H01L 41/09* (2006.01)

(52) U.S. Cl.
USPC ......... 310/321; 310/313 R; 310/320; 310/324

(58) Field of Classification Search
USPC ................ 310/321, 324, 320, 329; 333/187
See application file for complete search history.

(56) References Cited

U.S. PATENT DOCUMENTS

| | | | |
|---|---|---|---|
| 5,872,493 A * | 2/1999 | Ella | 333/191 |
| 6,864,619 B2 | 3/2005 | Aigner et al. | |
| 7,868,522 B2 * | 1/2011 | Ruby | 310/346 |
| 2005/0035420 A1 * | 2/2005 | Ma et al. | 257/414 |
| 2005/0110598 A1 * | 5/2005 | Larson, II | 333/191 |
| 2005/0200433 A1 * | 9/2005 | Aigner et al. | 333/191 |
| 2006/0170309 A1 * | 8/2006 | Philliber | 310/324 |
| 2007/0063622 A1 * | 3/2007 | Rudy | 310/341 |
| 2007/0096851 A1 * | 5/2007 | Uno et al. | 333/191 |
| 2007/0222336 A1 * | 9/2007 | Grannen et al. | 310/320 |
| 2008/0309432 A1 * | 12/2008 | Fattinger et al. | 333/189 |
| 2009/0045704 A1 * | 2/2009 | Barber et al. | 310/364 |

* cited by examiner

*Primary Examiner* — Derek Rosenau
*Assistant Examiner* — Bryan Gordon
(74) *Attorney, Agent, or Firm* — Morris Manning & Martin LLP; Tim Tingkang Xia, Esq.

(57) ABSTRACT

In one aspect of the invention, an acoustic wave device includes a substrate, and at least one acoustic wave resonator having a bottom electrode adjacent to the substrate, a top electrode, a piezoelectric layer sandwiched between the bottom and top electrodes, a passivation layer formed on the top electrode, and a mass load layer sandwiched between the substrate and the bottom electrode, or between the bottom electrode and the piezoelectric layer.

6 Claims, 11 Drawing Sheets

ACOUSTIC WAVE DEVICES

CROSS-REFERENCE TO RELATED PATENT APPLICATION

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference were individually incorporated by reference.

FIELD OF THE INVENTION

The present invention relates generally to an acoustic wave device, and more particularly, to an acoustic wave device having one or more acoustic wave resonators that utilize a mass load layer formed between the substrate and the piezoelectric layer to minimize the influence of trimming process on the mass load effect, and/or optimize the characteristics of the acoustic wave device.

BACKGROUND OF THE INVENTION

Mobile communications products, such as cellular phone and handsets, are required to be small and light. Such products require radio frequency (RF) filters approximately covering the range 0.5 GHz to 10 GHz to protect the received signal from interference, either from the transmitter in the same handset and/or from unwanted externally generated signals. These filters must have low pass-band insertion loss (typically<2 dB) in order to achieve adequate signal-to-noise ratio. Due to their high quality factor, superior power handling capability, low cost packaging on silicon and potential for integration above IC, thin film bulk acoustic wave (BAW) resonators and filters have been widely used in mobile radio communication devices. The simplest implementation of a BAW resonator comprises a thin layer of piezoelectric material, for example, aluminum nitride (AlN), zinc oxide, and PZT, arranged between two metal electrodes. A BAW resonator typically is acoustically isolated from the supporting substrate by an acoustic isolator, which may include a cavity formed under a membrane supporting a BAW resonator or an acoustic mirror that includes of a stack of layers alternately formed of high and low acoustic impedance materials.

The resonant frequency of a BAW device is primarily determined by the thickness of all the layers included in the material stack upon which a resonator is fabricated. To date, available deposition equipments can hardly ensure a tolerance on layer thicknesses better than 1%. During BAW resonator fabrication, there can be a wide distribution of resultant resonant frequencies (e.g., it can be as large as 50 MHz) after initial wafer processing due to non-uniformity of film deposition, which lead to filters out of specifications and undesirably affect device yield. As a result, a wafer trimming process is typically utilized, wherein a determined amount of material is removed from the top layer (e.g., the passivation layer) of the multi-layer film stack to achieve a target BAW filter operating frequency across the wafer and from wafer to wafer, thereby, improve the manufacturing yield. In the case of AlN and SiN used as the trimming layer material, more than 100 nm thickness material may have to be removed to compensate for variations of the resonant frequency induced by process deviations.

Figure 5:
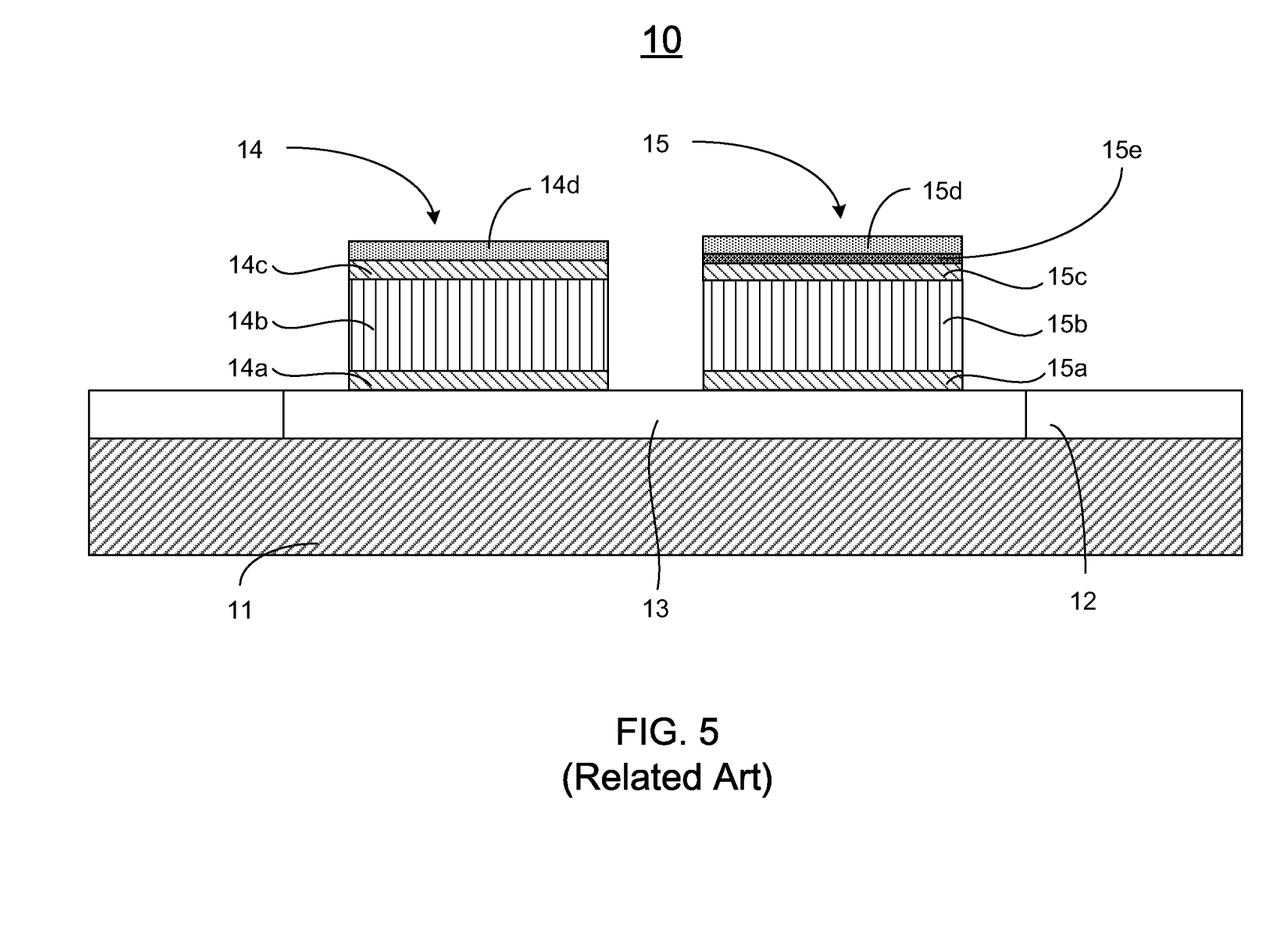
FIG. 5 shows schematically a cross sectional view of a conventional acoustic wave device.

FIG. 5 shows a conventional acoustic wave device 10 having a series acoustic wave resonator 14 and a shunt acoustic wave resonator 15 formed on a substrate 11, each having a piezoelectric layer 14b/15b sandwiched between a bottom electrode 14a/15a and a top electrode 14c/15c, and a passivation layer 14d/15d formed over the top electrode 14c/15c. Usually, the resonant frequencies of the shunt and series acoustic wave resonators differ by about 2% to about 7% and a mass load layer is added on the top electrode 15c of the shunt acoustic wave resonator 15 to shift its resonant frequency to a specified value relatively lower than the resonant frequency of the series resonator. However, as shown in FIGS. 6(a), 7(a) and 8(a), there is a considerable variation of the relative mass load effect versus the thickness of the trimming layer in the conventional acoustic wave device 10. This variation degrades the filter characteristics such as bandwidth and insertion loss, as shown in FIG. 9.

Therefore, a heretofore unaddressed need exists in the art to address the aforementioned deficiencies and inadequacies.

SUMMARY OF THE INVENTION

The present invention relates to an acoustic wave device with the utilization of a mass load layer located below a piezoelectric layer of the acoustic wave device so that the mass load effect in the acoustic wave device is almost independent of trimming.

In one aspect of the present invention, an acoustic wave device includes a substrate, one or more series acoustic wave resonators, each series acoustic wave resonator having a bottom electrode formed on the substrate, a piezoelectric layer formed on the bottom electrode, a top electrode formed on the piezoelectric layer, and a passivation layer formed on the top electrode, and one or more shunt acoustic wave resonators, each shunt acoustic wave resonator having a bottom electrode formed on the substrate, a mass load layer formed the bottom electrode, a piezoelectric layer formed on the mass load layer, a top electrode formed on the piezoelectric layer, and a passivation layer formed on the top electrode. The one or more series acoustic wave resonators and the one or more shunt acoustic wave resonators are coupled to each other in one of lattice and ladder configurations.

In one embodiment, the substrate is provided with an air cavity, whereby the one or more series acoustic wave resonators and the one or more shunt acoustic wave resonators are located over the air cavity. In another embodiment, the substrate is provided with an acoustic mirror, whereby the one or more series acoustic wave resonators and the one or more shunt acoustic wave resonators are located over the acoustic mirror.

In one embodiment, each of the bottom electrode, the piezoelectric layer, the top electrode and the passivation layer of each series acoustic wave resonator has a thickness in a range of about 5 nm to about 10 μm. Additionally, each of the bottom electrode, the mass load layer, the piezoelectric layer, the top electrode and the passivation layer of each shunt acoustic wave resonator has a thickness in a range of about 5 nm to about 10 μm. Preferably, the thickness of the mass load layer is in a range of about 5 nm to about 500 nm.

In one embodiment, each of the one or more series acoustic wave resonators and the one or more shunt acoustic wave resonator may have a seed layer formed between the substrate and the bottom electrode.

In another aspect of the present invention, an acoustic wave device includes a substrate, one or more series acoustic wave resonators, each series acoustic wave resonator having a bottom electrode formed on the substrate, a piezoelectric layer formed on the bottom electrode, a top electrode formed on the piezoelectric layer, and a passivation layer formed on the top electrode, and one or more shunt acoustic wave resonators, each shunt acoustic wave resonator having a mass load layer formed on the substrate, a bottom electrode formed on the mass load layer, a piezoelectric layer formed on the bottom electrode, a top electrode formed on the piezoelectric layer, and a passivation layer formed on the top electrode. The one or more series acoustic wave resonators and the one or more shunt acoustic wave resonators are coupled to each other in one of lattice and ladder configurations.

In one embodiment, the substrate is provided with an air cavity, whereby the one or more series acoustic wave resonators and the one or more shunt acoustic wave resonators are located over the air cavity. In another embodiment, the substrate is provided with an acoustic mirror, whereby the one or more series acoustic wave resonators and the one or more shunt acoustic wave resonators are located over the acoustic mirror.

In one embodiment, each of the bottom electrode, the piezoelectric layer, the top electrode and the passivation layer of each series acoustic wave resonator has a thickness in a range of about 5 nm to about 10 µm. Additionally, each of the bottom electrode, the mass load layer, the piezoelectric layer, the top electrode and the passivation layer of each shunt acoustic wave resonator has a thickness in a range of about 5 nm to about 10 µm. Preferably, the thickness of the mass load layer is in a range of about 5 nm to about 500 nm.

In one embodiment, each series acoustic wave resonator further comprises a seed layer formed between the substrate and the bottom electrode. Each shunt acoustic wave resonator further comprises a seed layer formed between the substrate and the mass load layer.

In yet another aspect of the present invention, an acoustic wave device includes a substrate, and at least one shunt acoustic wave resonator having a bottom electrode adjacent to the substrate, a top electrode, a piezoelectric layer sandwiched between the bottom and top electrodes, a passivation layer formed on the top electrode, and a mass load layer, where the mass load layer is sandwiched between the substrate and the bottom electrode, or between the bottom electrode and the piezoelectric layer. The mass load layer has a thickness in a range of about 5 nm to about 500 nm.

Further, the acoustic wave device includes at least one series acoustic wave resonator having a bottom electrode formed on the substrate, a top electrode, a piezoelectric layer sandwiched between the bottom electrode and the top electrode, and a passivation layer formed on the top electrode.

The at least one series acoustic wave resonator and the at least one shunt acoustic wave resonator are coupled to each other in one of lattice and ladder configurations.

In a further aspect of the present invention, an acoustic wave device includes a substrate, one or more series acoustic wave resonators, each series acoustic wave resonator having a first composite layered structure formed on the substrate, a bottom electrode formed on the first composite layered structure, a piezoelectric layer formed on the bottom electrode, a top electrode formed on the piezoelectric layer, and a passivation layer formed on the top electrode, and one or more shunt acoustic wave resonators, each shunt acoustic wave resonator having a second composite layered structure formed on the substrate, a bottom electrode formed on the second composite layered structure, a piezoelectric layer formed on the bottom electrode, a top electrode formed on the piezoelectric layer, and a passivation layer formed on the top electrode, where the second composite layered structure comprises a mass load layer with a thickness in a range of about 5 nm to about 500 nm. The one or more series acoustic wave resonators and the one or more shunt acoustic wave resonators are coupled to each other in one of lattice and ladder configurations.

In one embodiment, the first composite layered structure has a plurality of layers alternately formed of a high acoustic impedance material and a low acoustic impedance material, where the high acoustic impedance layers and the low acoustic impedance layers are alternately adjacently disposed.

In one embodiment, the second composite layered structure further has a plurality of layers alternately formed of a high acoustic impedance material and a low acoustic impedance material, where the high acoustic impedance layers and the low acoustic impedance layers are alternately adjacently disposed such that the mass load layer is sandwiched between a low acoustic impedance layer and a high acoustic impedance layer adjacent to the low acoustic impedance layer.

In yet a further aspect of the present invention, a method for fabricating an acoustic wave resonator comprises the steps of providing a substrate with a sacrificial layer, forming a multilayered structure on the sacrificial layer, the multilayered structure having a bottom electrode and a mass load layer, forming a piezoelectric layer on the multilayered structure, forming a top electrode on the piezoelectric layer; and removing the sacrificial layer to form an air cavity.

Additionally, the method also includes the step of forming a passivation layer on the top electrode.

In one embodiment, the step of forming the multilayered structure includes the steps of forming a seed layer on the sacrificial layer, depositing a conductive material on the seed layer, performing a lift-off process to form a mass load layer on the deposited conductive material, applying a patterned mask, and etching the conductive material and the seed layer in accordance with the patterned mask to form the bottom electrode, where the lift-off process comprises the steps of applying a mass load pattern on the conductive material, depositing a mass load, and lifting off the mass load.

In another embodiment, the step of forming the multilayered structure includes the steps of forming a seed layer on the sacrificial layer, performing a lift-off process to form a mass load layer on the seed layer, depositing a conductive material on the mass load layer, applying a patterned mask, and etching the conductive material and the seed layer in accordance with the patterned mask to form the bottom electrode. The lift-off process comprises the steps of applying a mass load pattern on the sacrificial layer, depositing a mass load, and lifting off the mass load.

In one aspect of the present invention, a method for fabricating an acoustic wave device having at least one acoustic wave resonator includes the step of forming the at least one acoustic wave resonator. In one embodiment, the step of forming the at least one acoustic wave resonator comprises the steps of providing a substrate with a sacrificial layer, forming a multilayered structure on the sacrificial layer, the multilayered structure having a bottom electrode and a mass load layer, forming a piezoelectric layer on the multilayered structure, forming a top electrode on the piezoelectric layer, and removing the sacrificial layer to form an air cavity.

In one embodiment, the step of forming the multilayered structure includes the steps of forming a seed layer on the sacrificial layer, depositing a conductive material on the seed layer, performing a lift-off process to form a mass load layer on the deposited conductive material, applying a patterned mask, and etching the conductive material and the seed layer in accordance with the patterned mask to form the bottom electrode.

In another embodiment, the step of forming the multilayered structure includes the steps of forming a seed layer on the sacrificial layer, performing a lift-off process to form a mass load layer on the seed layer, depositing a conductive material on the mass load layer, applying a patterned mask, and etching the conductive material and the seed layer in accordance with the patterned mask to form the bottom electrode.

In one embodiment, the step of forming the at least one shunt acoustic wave resonator may also include the step of forming a passivation layer on the top electrode.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment, and wherein:

FIG. 6 shows the mass load effects versus the thickness of the trimming layer for (a) a conventional acoustic wave device, and (b) an acoustic wave device according to one embodiment of the present invention, respectively;

FIG. 7 shows the mass load effects versus the thickness of the trimming layer for (a) a conventional acoustic wave device, and (b) an acoustic wave device according to another embodiment of the present invention, respectively;

FIG. 8 shows the mass load effects versus the thickness of the trimming layer for (a) a conventional acoustic wave device, and (b) an acoustic wave device according to yet another embodiment of the present invention, respectively;

DETAILED DESCRIPTION OF THE INVENTION

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, "plurality" means two or more.

As used herein, the terms "comprising," "including," "carrying," "having," "containing," "involving," and the like are to be understood to be open-ended, i.e., to mean including but not limited to.

The term "layer", as used herein, refers to a thin sheet or thin film.

The term "electrode", as used herein, is an electrically conductive layer or film comprising a single-layer structure or a multi-layer structure formed of one or more electrically conductive materials.

The term "piezoelectric layer" as used herein, is a layer comprising one or more different layers, of which at least one exhibits piezoelectric activity. The other layers may be non-piezoelectric dielectric or used to perform special performance effects like temperature coefficient compensation or to facilitate manufacturing like adhesion layers. In addition, the other layers are typically thin when compared to the at least one layer exhibiting piezoelectric activity.

The description will be made as to the embodiments of the present invention in conjunction with the accompanying drawings. In accordance with the purposes of this invention, as embodied and broadly described herein, this invention, in one aspect, relates to an acoustic wave device, such as a band-pass filter, that utilizes a mass load layer located below a piezoelectric layer of a shunt acoustic wave resonator so that the mass load effect in the acoustic wave device is almost independent of trimming layer thickness change.

Figure 1:
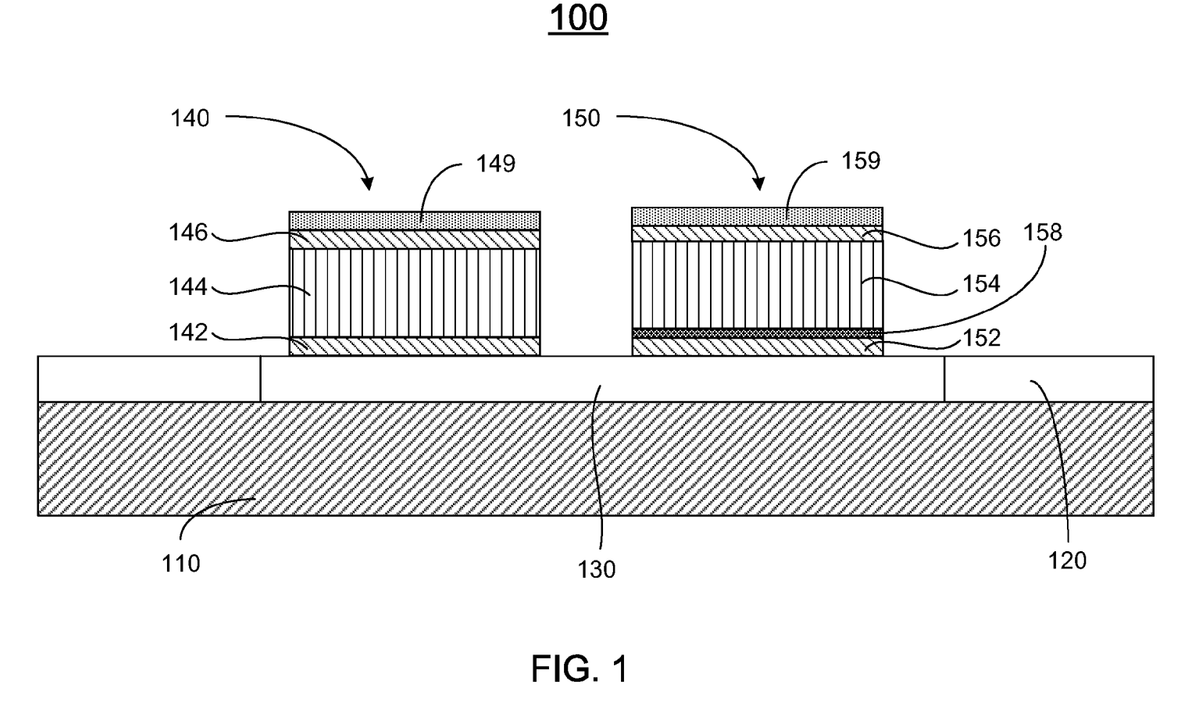
FIG. 1 shows schematically a cross sectional view of an acoustic wave device according to one embodiment of the present invention.

Referring to FIG. 1, an acoustic wave device 100 is shown according to one embodiment of the present invention. The acoustic wave device 100 includes one or more series acoustic wave resonators 140 and one or more shunt acoustic wave resonators 150. The one or more series acoustic wave resonators 140 and the one or more shunt acoustic wave resonators 150 are coupled to each other in a ladder configuration, for example, shown in FIG. 4, or in a lattice configuration. The acoustic wave device 100 can be, but not limited to, a pass-band filter, a band-reject filter, or a transmitter/receiver duplexer.

For the purpose of illustration of the present invention, in the exemplary embodiment of FIG. 1, the acoustic wave device 100 has one series acoustic wave resonator 140 and one shunt acoustic wave resonator 150 formed on a substrate 110.

The series acoustic wave resonator 140 has a bottom electrode 142 formed on the substrate 110, a piezoelectric layer 144 formed on the bottom electrode 142, a top electrode 146 formed on the piezoelectric layer 144, and a passivation layer 149 formed on the top electrode 146.

The bottom and top electrodes 142 and 146 are formed of a same metal material or different metal materials, such as gold (Au), tungsten (W), molybdenum (Mo), platinum (Pt), ruthenium (Ru), iridium (Ir), titanium tungsten (TiW), aluminum (Al), or titanium (Ti), or the like. The piezoelectric layer 144 is formed of, for example, but not limited to, aluminum nitride (AlN), zinc oxide (ZnO), lead zirconate titantate (PZT), quartz, lithium niobate ($LiNbO_3$), potassium niobate ($KNbO_3$), or lithium tantalate ($LiTaO_3$). The passivation layer 149 is formed of a material including, but not limited to, aluminum nitride (AlN), silicon carbide (SiC), aluminum oxide ($Al_2O_3$), diamond, diamond-like carbon (DLC), silicon oxide ($SiO_2$), silicon nitride (SiN), hydrophobic polymer, or the like. Each of the bottom electrode 142, the piezoelectric layer 144, the top electrode 146 and the passivation layer 149 has a thickness in a range of about 5 nm to about 10 μm.

As shown in FIG. 1, the shunt acoustic wave resonator 150 includes a bottom electrode 152 formed on the substrate 110, a mass load layer 158 formed the bottom electrode 152, a piezoelectric layer 154 formed on the mass load layer 158, a top electrode 156 formed on the piezoelectric layer 154, and a passivation layer 159 formed on the top electrode 156.

Similarly, the bottom and top electrodes 152 and 156 are formed of a same metal material or different metal materials, such as gold (Au), tungsten (W), molybdenum (Mo), platinum (Pt), ruthenium (Ru), iridium (Ir), titanium tungsten (TiW), aluminum (Al), or titanium (Ti), or the like. The piezoelectric layer 154 is formed of, for example, but not limited to, aluminum nitride (AlN), zinc oxide (ZnO), lead zirconate titantate (PZT), quartz, lithium niobate ($LiNbO_3$), potassium niobate ($KNbO_3$), or lithium tantalate ($LiTaO_3$). The passivation layer 159 is formed of a material including, but not limited to, aluminum nitride (AlN), silicon carbide (SiC), aluminum oxide ($Al_2O_3$), diamond, diamond-like carbon (DLC), silicon oxide ($SiO_2$), silicon nitride (SiN), hydrophobic polymer, or the like.

According to the present invention, a wide rang of materials including metals (e.g., Al and Mo) and dielectrics (e.g., silicon carbide, silicon oxide, and silicon nitride) can be used to form the mass load layer 158. In many cases, materials having low acoustic loss and high acoustic impedance such as tungsten, molybdenum, platinum, tantalum, ruthenium, iridium, titanium tungsten, tantalum oxide, zirconium oxide, and silicon carbide are preferred, such that the mass load layer 158 is relatively thin and does not have negative effect on the electrical performance (e.g., Q factor) of the resonator. In addition, a metal material deposited with sputtering process is more suitable, because it usually has very good film thickness uniformity (within wafer standard deviation could be smaller than 0.5%).

In one embodiment, each of the bottom electrode 152, the mass load layer 158, the piezoelectric layer 154, the top electrode 156 and the passivation layer 159 has a thickness in a range of about 5 nm to about 10 μm. Preferably, the thickness of the mass load layer 158 is in a range of about 5 nm to about 500 nm.

Additionally, each of the series acoustic wave resonator 140 and the shunt acoustic wave resonator 150 further includes a seed layer (not shown) formed between the substrate 110 and the bottom electrode 142/152. The seed layer may be formed of a material of aluminum nitride (AlN), aluminum oxynitride (AlON), tungsten nitride (WN), titanium tungsten nitride (TiWN), silicon oxide ($SiO_2$), silicon nitride ($Si_3N_4$), silicon carbide (SiC), or the like.

The substrate 110 is provided with an air cavity or acoustic mirror, or with dielectric layer 120 defining an air cavity or acoustic mirror 130 under the series acoustic wave resonator 140 and the shunt acoustic wave resonator 150.

Figure 2:
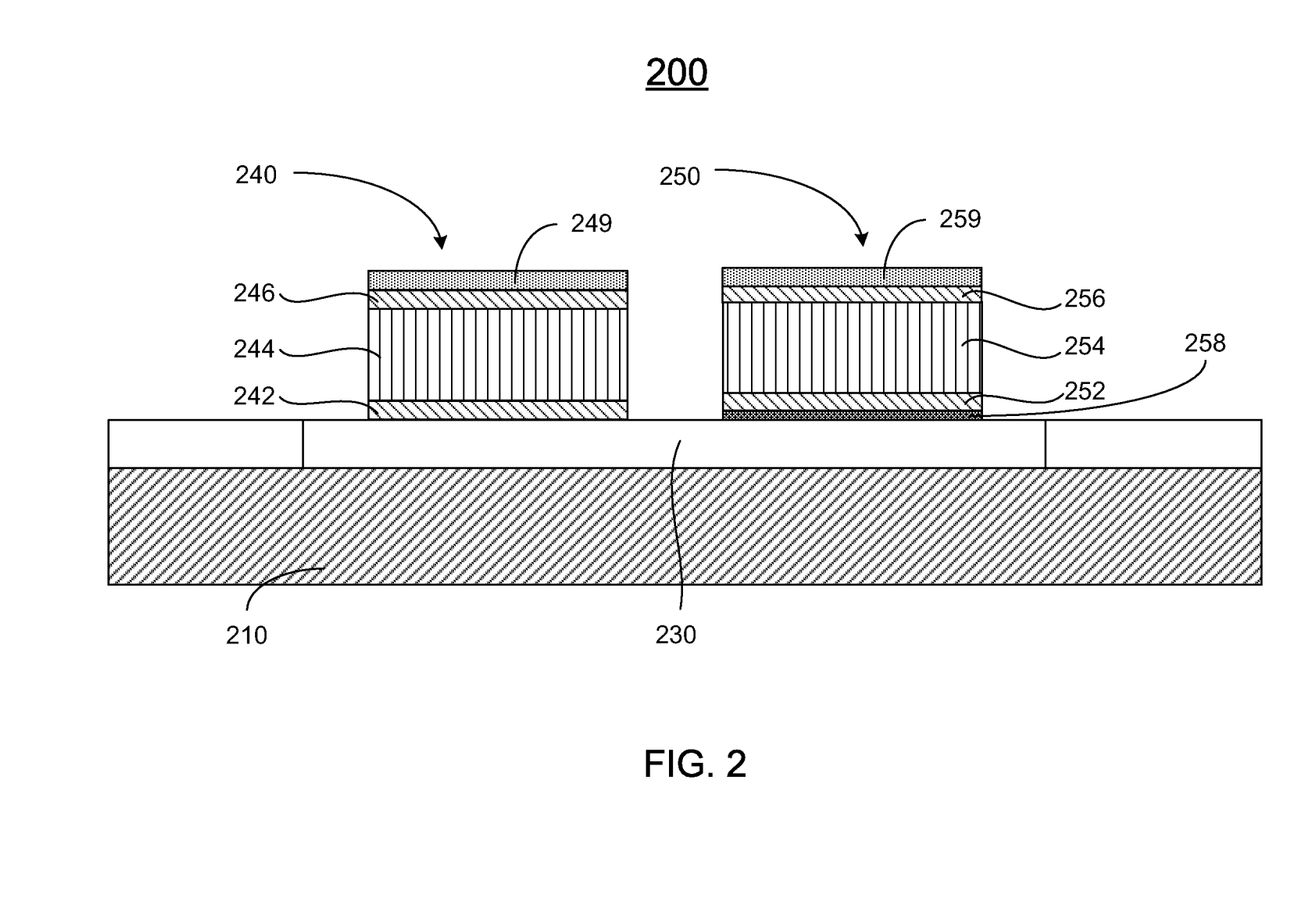
FIG. 2 shows schematically a cross sectional view of an acoustic wave device according to another embodiment of the present invention.

FIG. 2 shows another embodiment of an acoustic wave device 200 according to the present invention. Similar to the acoustic wave device 100 shown in FIG. 1, the acoustic wave device 200 includes a series acoustic wave resonator 240 and a shunt acoustic wave resonator 250 formed on a substrate 210. The acoustic wave device 200 may include two or more series acoustic wave resonators 240 and two or more shunt acoustic wave resonators 250 coupled to each other in a ladder configuration, for example, shown in FIG. 4, or in a lattice configuration. The series acoustic wave resonator 240 has a bottom electrode 242 formed on the substrate 210, a top electrode 246, a piezoelectric layer 244 sandwiched between the bottom electrode 242 and the top electrode 246, and a passivation layer 249 formed on the top electrode 246. The shunt acoustic wave resonator 250 has a bottom electrode 252, a piezoelectric layer 254, a top electrode 256, a mass load layer 258, and a passivation layer 259. However, the mass load layer 258 is formed on the acoustic isolator 230. The bottom electrode 252 is formed on the mass load layer 258. The piezoelectric layer 254 is formed on the bottom electrode 252. The top electrode 256 is formed on the piezoelectric layer 254. The passivation layer 259 is formed on the top electrode 256.

Each of the bottom electrode 242/252, the top electrode 246/256, the piezoelectric layer 244/254, the passivation layer 249/259 and the mass load layer 258 is formed of a respective material disclosed above, and has a thickness in a range of about 5 nm to about 10 µm. Preferably, the thickness of the mass load layer 258 is in a range of about 5 nm to about 500 nm.

Figure 3:
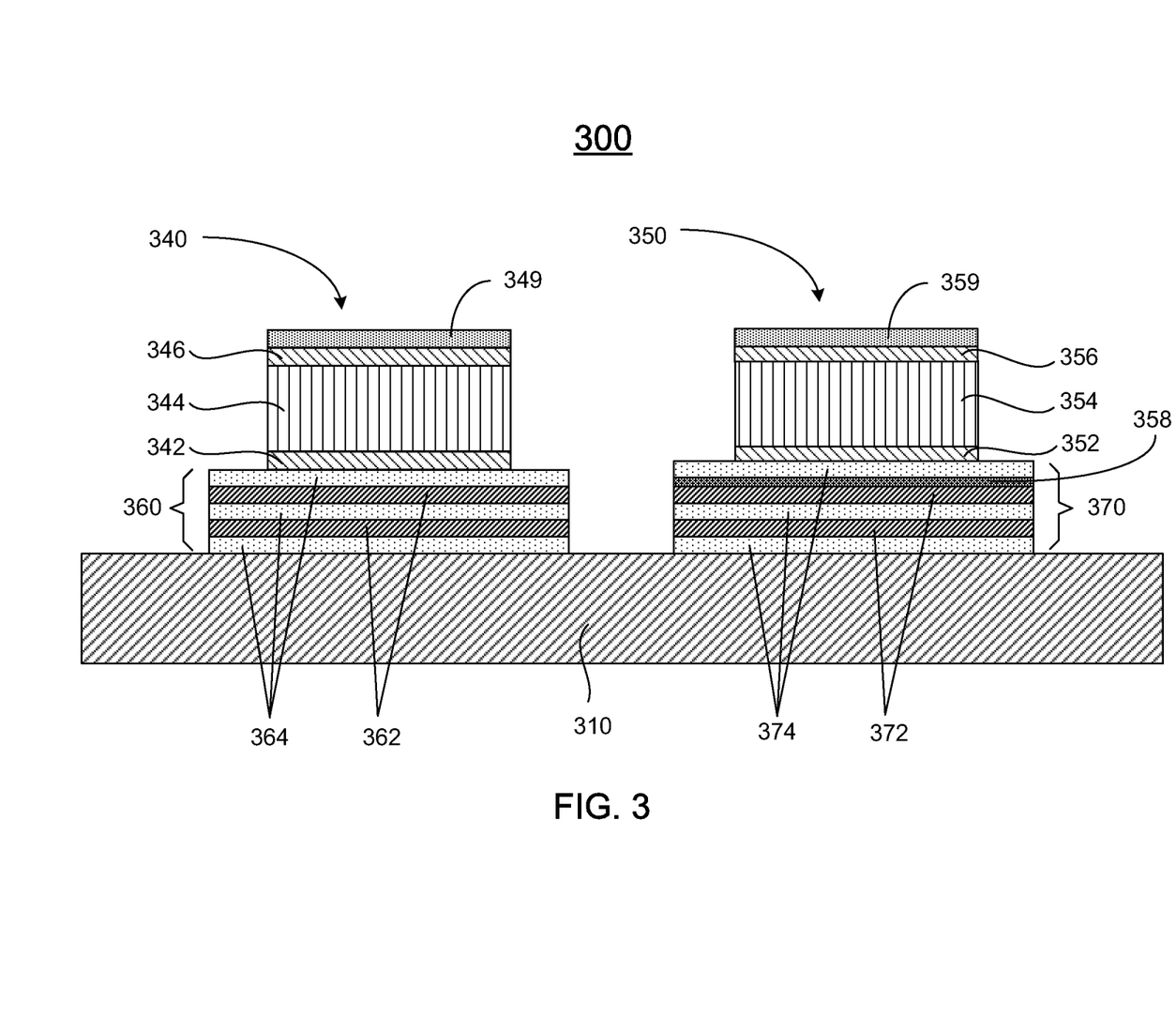
FIG. 3 shows schematically a cross sectional view of an acoustic wave device according to yet another embodiment of the present invention.

Referring to FIG. 3, an acoustic wave device 300 is shown according to one embodiment of the present invention. In this exemplary embodiment, the acoustic wave device 300 includes a series acoustic wave resonator 340 and a shunt acoustic wave resonator 350 formed on a substrate 310. The acoustic wave device 300 may include two or more series acoustic wave resonators 340 and two or more shunt acoustic wave resonators 350 coupled to each other in a ladder configuration, for example, shown in FIG. 4, or in a lattice configuration.

Each of the series and shunt acoustic wave resonators 340/350 has a composite layered structure 360/370 formed on the substrate 310, a bottom electrode 342/352 formed on the composite layered structure 360/370, a piezoelectric layer 344/354 formed on the bottom electrode 342/352, a top electrode 346/356 formed on the piezoelectric layer 344/354, and a passivation layer 349/359 formed on the top electrode 346/356.

As shown in FIG. 3, each composite layered structure 360/370 has a plurality of high acoustic impedance layers 362/372 and low acoustic impedance layers 364/374 alternately adjacently disposed. In addition, the composite layered structure 370 of the shunt acoustic wave resonator 350 also has a mass load layer 358 sandwiched between a low acoustic impedance layer 374 and a high acoustic impedance layer 372 adjacent to the low acoustic impedance layer 374. In one embodiment, the low impedance layer 374 is in contact with the bottom electrode 352. The mass load layer 358 can be formed of a metal material, e.g., Al or Mo, or a dielectric material, e.g., silicon carbide, silicon oxide, or silicon nitride. Preferably, materials having low acoustic loss and high acoustic impedance such as W, Mo, platinum, ruthenium, iridium, titanium tungsten, and silicon carbide are preferred, such that the mass load layer 358 is relatively thin and does not have negative effect on the electrical performance (e.g., Q factor) of the resonator. The mass load layer 358 has a thickness in a range of about 5 nm to about 500 nm.

Figure 4:
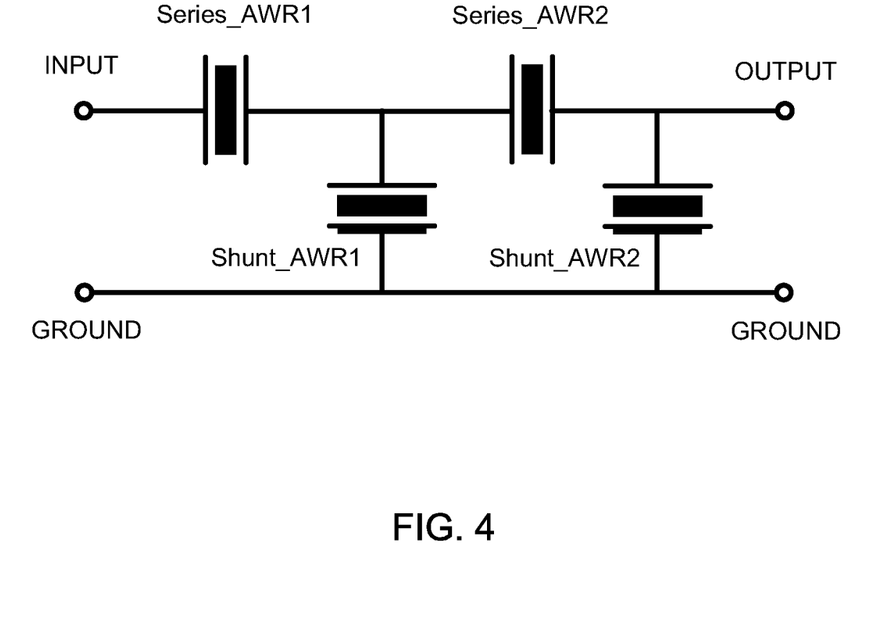
FIG. 4 shows schematically a circuit diagram of an acoustic wave device according to one embodiment of the present invention.

FIG. 4 illustrates a BAW filter or device with a ladder topology that contains two series acoustic wave resonators, Series_AWR1 and Series_AWR2, and two shunt acoustic wave resonators, Shunt_AWR1 and Shunt_AWR2. The first series acoustic wave resonator Series_AWR1 is coupled to the input node, while the second series acoustic wave resonator Series_AWR2 is coupled to the output mode. The shunt acoustic wave resonators Shunt_AWR1 and Shunt_AWR2 are coupled to ground potential. Usually, the resonant frequency of the shunt acoustic wave resonators is typically lower than that of the series acoustic wave resonators by about 2% to about 7%. According to the present invention, the utilization of an additional mass load layer with a desired thickness, formed between the substrate and the piezoelectric layer of the shunt acoustic wave resonators, as disclosed in FIGS. 1-3, could reduce the resonant frequency of the shunt acoustic wave resonators to a specified target frequency value.

Figure 6:
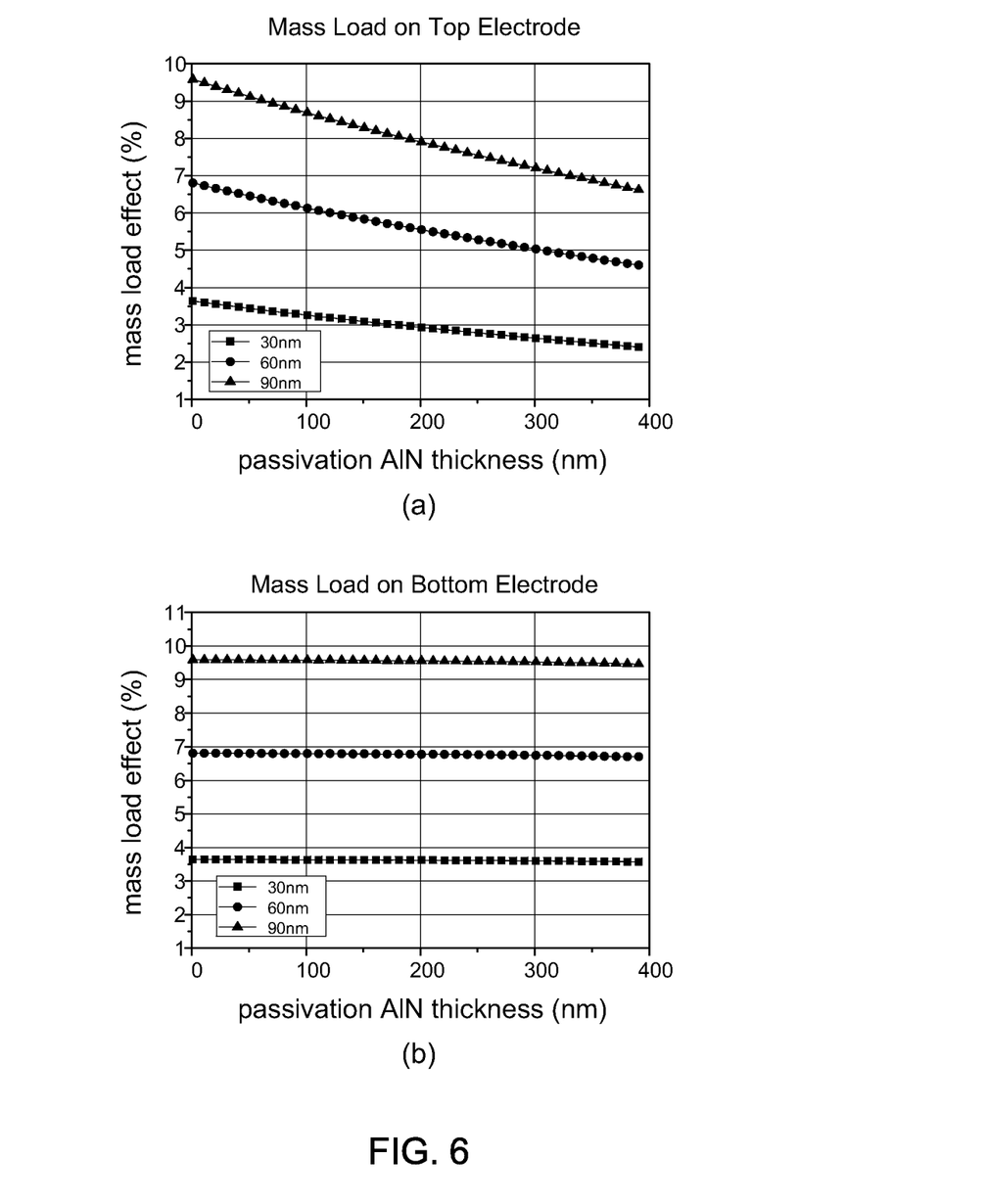
Figure 7:
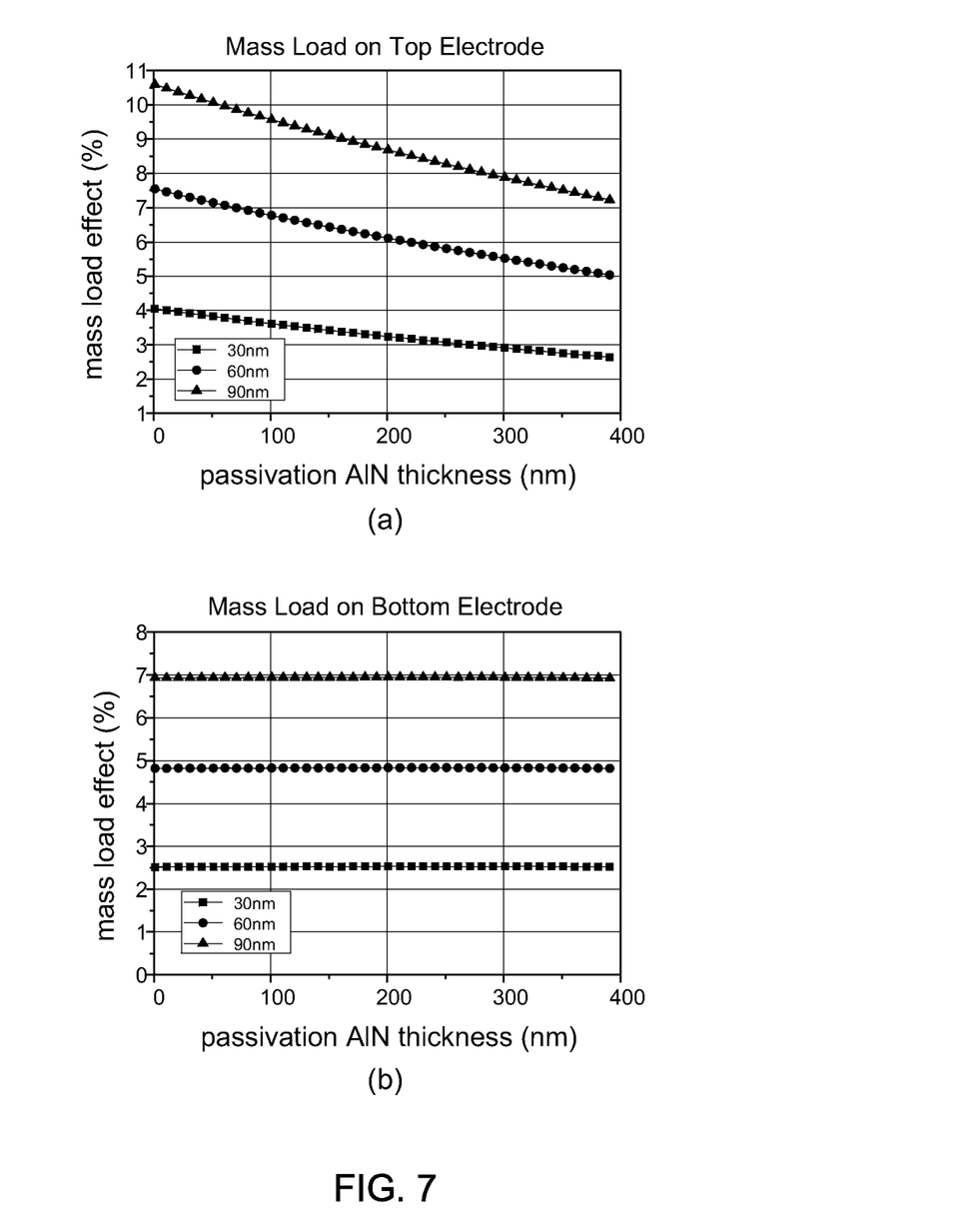
Figure 8:
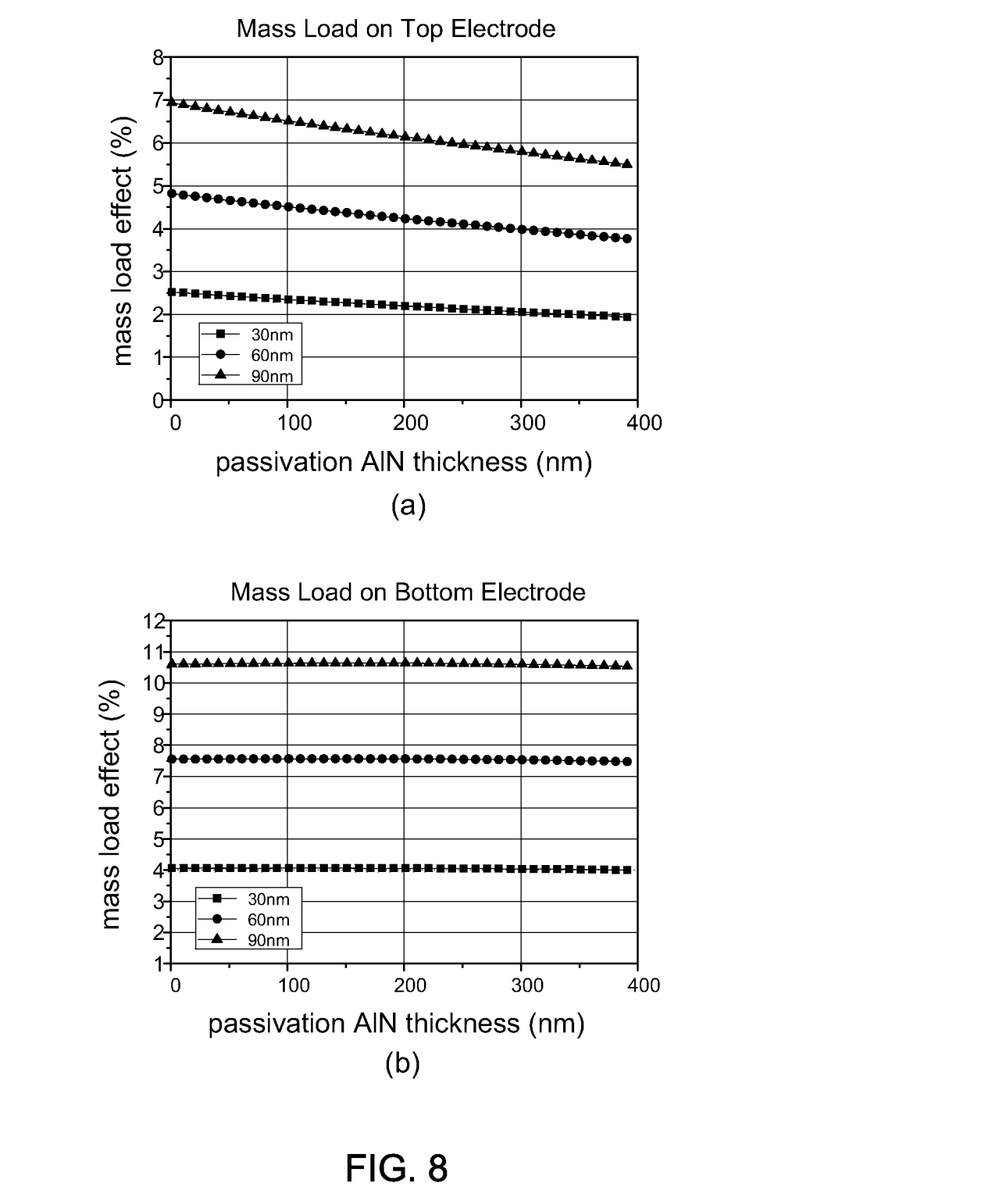
Figure 9:
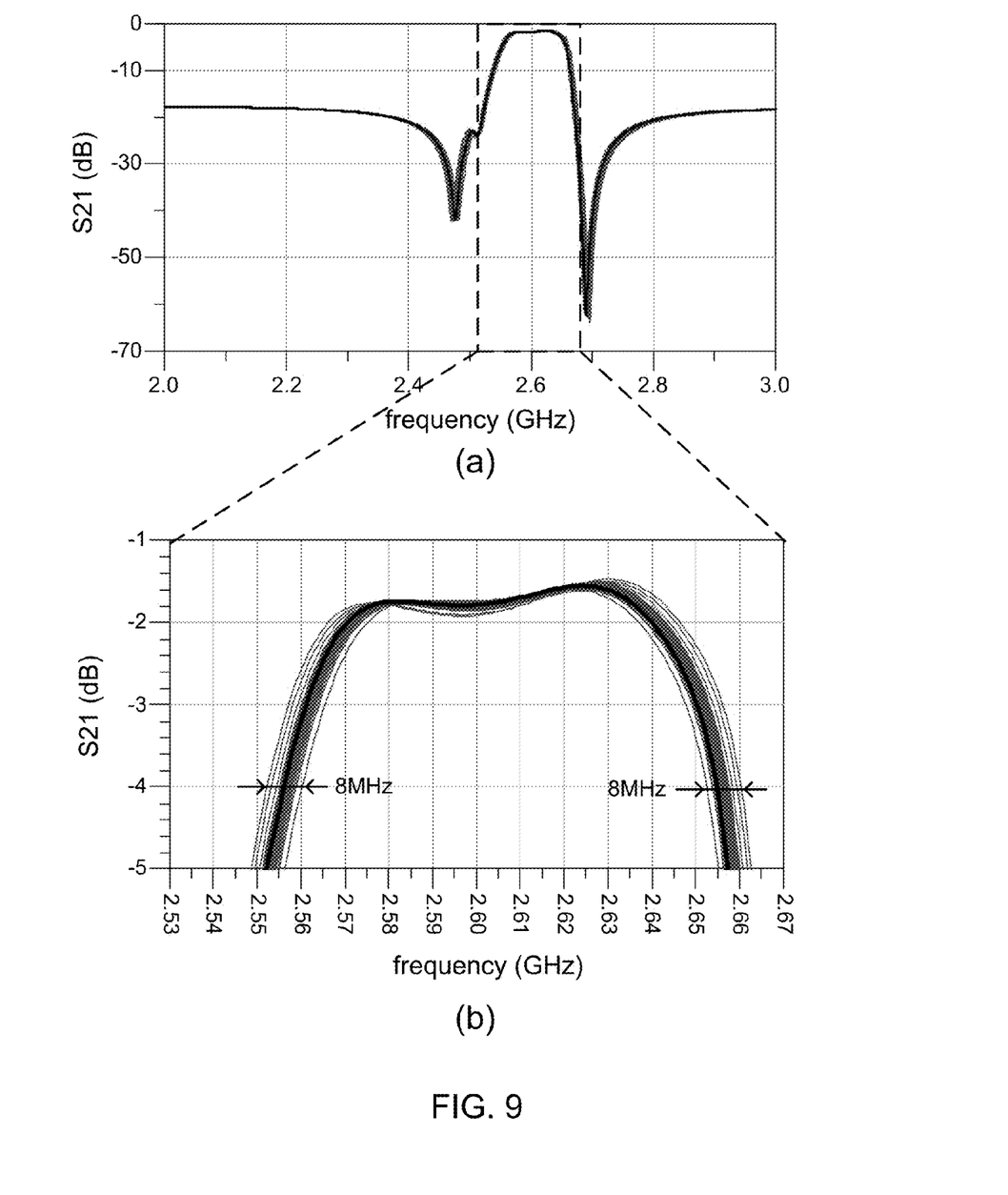
FIG. 9 shows a Monte Carlo simulation of the S parameters for conventional acoustic band-pass filters.

FIGS. 6-8 show the dependence of the mass load effect on the thickness of the trimming layer (i.e., aluminum nitride), where the mass load layer is placed on the top electrode and the bottom electrode, respectively. The trimming layer is usually the topmost layer of the acoustic wave resonator, and is used as passivation purpose as well. Specifically, FIGS. 6(a), 7(a) and 8(a) present the mass load effect variations when trimming a conventional shunt acoustic wave resonator having a substrate, a bottom electrode, a piezoelectric layer, a top electrode, a mass load layer and a passivation layer (i.e., the trimming layer) stacked vertically in sequence, as shown in FIG. 5, with different layer thicknesses, while FIGS. 6(b), 7(b) and 8(b) present the mass load variations when trimming a shunt acoustic wave resonator of the invention having a substrate, a bottom electrode formed on the substrate, a mass load layer formed on the bottom electrode, a piezoelectric layer formed on the mass load layer, a top electrode formed on the piezoelectric layer, and a passivation layer formed on the top electrode, as shown in FIG. 1, with different layer thicknesses.

In the resonators corresponding to FIGS. 6-8, the mass load layer, the bottom electrode, the piezoelectric layer, the top electrode and the passivation layer are formed of Mo, Mo, AlN, Mo and AlN, respectively. In FIGS. 6-8, the three curves correspond to three thicknesses of 30 nm, 60 nm and 90 nm of the mass load layer, respectively. For FIG. 6, the bottom electrode, the piezoelectric layer and the top electrode of the resonators have thicknesses of 150 nm, 1048 nm and 150 nm, respectively. For FIG. 7, the bottom electrode, the piezoelectric layer and the top electrode of the resonators have thicknesses of 300 nm, 800 nm and 150 nm, respectively. For FIG. 8, the bottom electrode, the piezoelectric layer and the top electrode of the resonators have thicknesses of 150 nm, 800 nm and 300 nm, respectively. The bottom electrode thickness is equal to, larger and smaller than the top electrodes, respectively.

Figure 10:
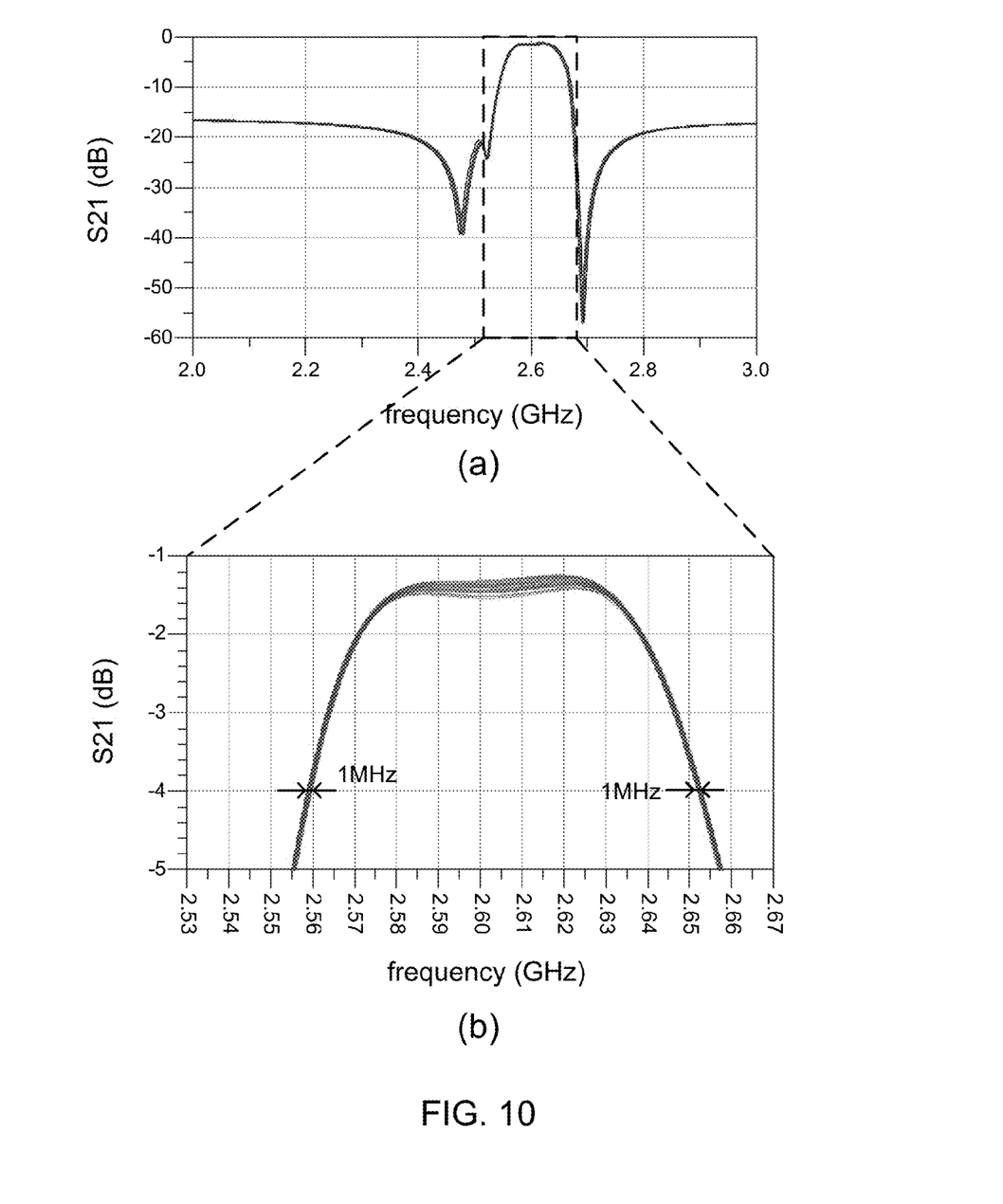
FIG. 10 shows a Monte Carlo simulation of the S parameters for acoustic band-pass filters according to one embodiment of the present invention.

As noted, there is a considerable variation of the relative mass load effect versus the thickness of the trimming layer when the mass load layer is arranged on the top electrode, for example, as shown in FIGS. 6(a), 7(a) and 8(a). This variation degrades the filter characteristics such as bandwidth and insertion loss, as shown in FIG. 9. Thus, the trimming range is highly limited to allow the mass load effect in an acceptable tolerance and maintain a good filter performance. In contrast, as shown in FIGS. 6(b), 7(b) and 8(b), the curves are almost flat when the mass load layer is put on the bottom electrode in all three different cases. Consequently, the filter performance is not undesirably affected by the trimming process as shown in FIG. 10. Thus, it is advantageous and desirable to provide a resonator and filter where the mass load layer is placed below piezoelectric layer, such that the relative mass load effect is within a tight tolerance range when the resonant frequency is trimmed over a great frequency range.

A band-pass filter is formed of a set of series and shunt resonators electrically coupled to each other in a ladder configuration. With mass load layers introduced, the shunt resonators present lower resonant frequencies than the series resonators, creating a band-pass characteristic of the filter. The width of the filter pass-band is dependent on separation of the resonant frequencies of the series and shunt resonators. The center frequency of the filter is predominantly determined by thicknesses of the layers constituting the resonators, which exhibits a distribution across wafer due to non-uniform deposition of thin films in the fabrication of the devices. A trimming process on passivation layer of a filter could tune the center frequency of the filter to a desired target by removing a predetermined amount of passivation material from the resonator. A Monte Carlo Simulation has been performed to emulate the transmission characteristics of 50 filters on a wafer, with thickness uniformity of Mo, AlN and passivation films set to be 1.5%, 2% and 3% in the simulation, respectively. FIG. 9 is a graphic representation of S parameters versus frequency of 50 filters in accordance with a conventional configuration of which the mass load layer is disposed on the top electrode of the shunt resonators. The simulated filters have the center frequencies widely distributed originally, and have been adjusted to a same value using a presumably ideal trimming process. The filters demonstrate a large variation of pass-band width (up to 16 MHz difference), because the frequency separations between series and shunt resonators have relatively large difference from filter to filter. However, in the case of which the mass load layer is disposed on the bottom electrode of the resonator according to the present invention, the variation of the pass-band width is greatly reduced to about 2 MHz, as shown in FIG. 10, indicating much more uniform separations between series and shunt resonators achieved by introducing the mass load layer on the bottom electrode.

Figure 11:
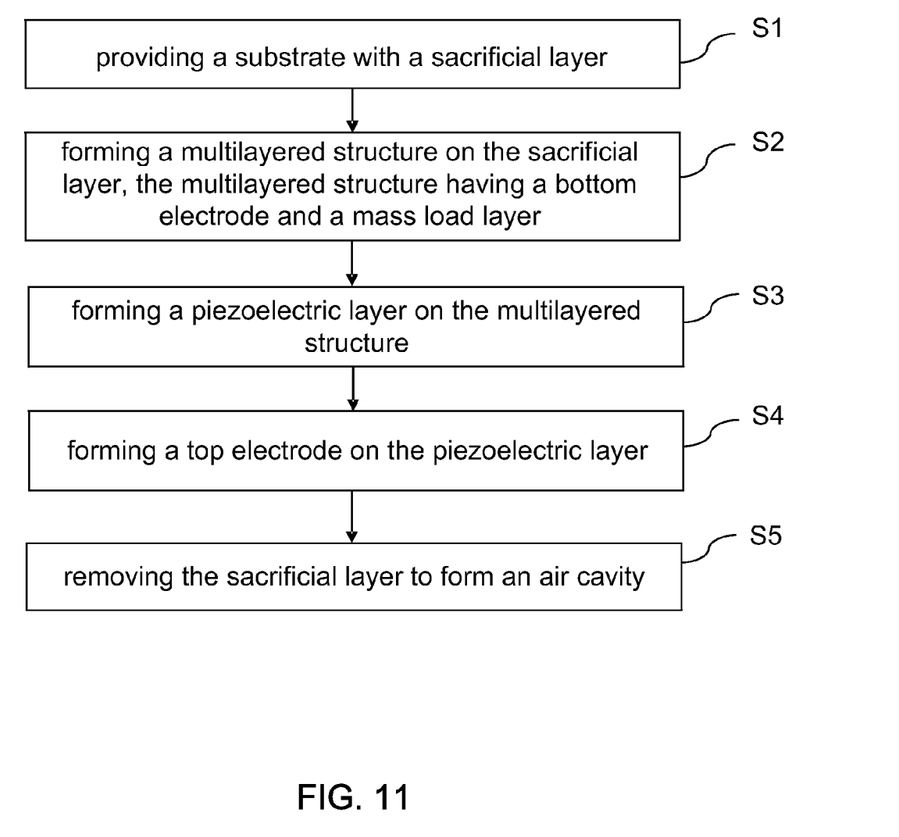
FIG. 11 shows schematically a process for fabricating an acoustic wave device according to one embodiment of the present invention.

Referring to FIG. 11, a fabrication process for an acoustic wave resonator with mass load layer is shown according to one embodiment of the present invention. In this embodiment, the fabrication process includes the following steps. At step S1, a substrate with a sacrificial layer is provided. Then, a multilayered structure is formed on the sacrificial layer at step S2. The multilayered structure has a bottom electrode and a mass load layer. In one embodiment, the multilayered structure is formed by forming a seed layer on the sacrificial layer, depositing a conductive material on the seed layer, performing a lift-off process to form a mass load layer on the deposited conductive material, applying a patterned mask, and etching the conductive material and the seed layer in accordance with the patterned mask to form the bottom electrode, where the lift-off process is performed by applying a mass load pattern on the conductive material, depositing a mass load, and lifting off the mass load. In another embodiment, the multilayered structure is formed by forming a seed layer on the sacrificial layer, performing a lift-off process to form a mass load layer on the seed layer, depositing a conductive material on the mass load layer, applying a patterned mask, and etching the conductive material and the seed layer in accordance with the patterned mask to form the bottom electrode.

At step S3, a piezoelectric material, such as AlN, is deposited on the multilayered structure to form a piezoelectric layer thereon. At step S4, a top electrode of a conductive material, e.g., Mo, is deposited on the piezoelectric layer. Then, the sacrificial layer is removed by etching or other removing means, so as to form an air cavity, at step S5. Additionally, the fabrication process also includes the step of forming a passivation layer on the top electrode.

Each of the bottom electrode, the mass load layer, the piezoelectric layer, the top electrode and the passivation layer has a thickness in a range of about 5 nm to about 10 μm. Preferably, the thickness of the mass load layer is in a range of about 5 nm to about 500 nm.

According to the present invention, the fabrication process for a shunt acoustic wave resonator as disclosed above is also adapted for fabricating an acoustic wave device including one or more shunt acoustic wave resonators.

In summary, the present invention, among other things, recites an acoustic wave device having one or more acoustic wave resonators that utilize a mass load layer formed between the substrate and the piezoelectric layer to minimize the influence of trimming process on the mass load effect, and/or optimize the characteristics of the acoustic wave device.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An acoustic wave device, comprising:
   (a) a substrate;
   (b) one or more series acoustic wave resonators, each series acoustic wave resonator having a bottom electrode formed on the substrate, a piezoelectric layer formed on the bottom electrode, a top electrode formed on the piezoelectric layer, and a passivation layer formed on the top electrode; and
   (c) one or more shunt acoustic wave resonators, each shunt acoustic wave resonator having a bottom electrode formed directly on the substrate, a mass load layer formed directly on the bottom electrode, a piezoelectric layer formed directly on the mass load layer, a top electrode formed directly on the piezoelectric layer, and a passivation layer formed on the top electrode, such that the bottom electrode, the mass load layer, the piezoelectric layer, the top electrode and the passivation layer are sequentially stacked over the substrate, wherein the bottom electrode comprises one of tungsten, molybdenum, platinum, ruthenium, iridium, titanium tungsten, titanium, and a combination of them, wherein the mass load layer comprises one of tungsten, molybdenum, platinum, tantalum, ruthenium, iridium, titanium tungsten, silicon nitride and silicon carbide, and wherein the mass load layer is substantially in contact with the bottom electrode,
   wherein the one or more series acoustic wave resonators and the one or more shunt acoustic wave resonators are coupled to each other in one of lattice and ladder configurations.

2. The acoustic wave device of claim 1, wherein the substrate is provided with an air cavity or an acoustic mirror, whereby the one or more series acoustic wave resonators and the one or more shunt acoustic wave resonators are located over the air cavity or the acoustic mirror.

3. The acoustic wave device of claim 1, wherein the mass load layer has a thickness in a range of about 5 nm to about 500 nm.

4. An acoustic wave device, comprising:
(a) a substrate;
(b) one or more series acoustic wave resonators, each series acoustic wave resonator having a first composite layered structure formed on the substrate, a bottom electrode formed on the first composite layered structure, a piezoelectric layer formed on the bottom electrode, a top electrode formed on the piezoelectric layer, and a passivation layer formed on the top electrode; and
(c) one or more shunt acoustic wave resonators, each shunt acoustic wave resonator having a second composite layered structure formed on the substrate, a bottom electrode formed on the second composite layered structure, a piezoelectric layer formed on the bottom electrode, a top electrode formed on the piezoelectric layer, and a passivation layer formed on the top electrode, wherein the second composite layered structure comprises a mass load layer and a plurality of layers alternately formed of a high acoustic impedance material and a low acoustic impedance material, wherein the high acoustic impedance layers and the low acoustic impedance layers are alternately adjacently disposed such that the mass load layer is sandwiched between a low acoustic impedance layer and a high acoustic impedance layer adjacent to the low acoustic impedance layer, wherein the one or more series acoustic wave resonators and the one or more shunt acoustic wave resonators are coupled to each other in one of lattice and ladder configurations.

5. The acoustic wave device of claim 4, wherein the first composite layered structure comprises a plurality of layers alternately formed of a high acoustic impedance material and a low acoustic impedance material, wherein the high acoustic impedance layers and the low acoustic impedance layers are alternately adjacently disposed.

6. The acoustic wave device of claim 4, wherein the mass load layer has a thickness in a range of about 5 nm to about 500 nm.

* * * * *